United States Patent [19]

Nishino et al.

[11] Patent Number: 5,317,168

[45] Date of Patent: May 31, 1994

[54] SUPERCONDUCTING FIELD EFFECT TRANSISTOR

[75] Inventors: Toshikazu Nishino, Kawasaki; Ushio Kawabe; Fumio Murai, both of Tokyo; Tokuo Kure, Tokyo; Mutsuko Hatano, Kodaira; Haruhiro Hasegawa, Kokubunji, all of Japan

[73] Assignee: Hitachi, Ltd., Tokyo, Japan

[21] Appl. No.: 978,454

[22] Filed: Nov. 19, 1992

Related U.S. Application Data

[63] Continuation of Ser. No. 800,736, Dec. 3, 1991, abandoned, which is a continuation of Ser. No. 687,771, Apr. 19, 1991, abandoned, which is a continuation of Ser. No. 305,367, Feb. 1, 1989, abandoned.

[30] Foreign Application Priority Data

Feb. 5, 1988 [JP] Japan .................................. 63-23670
Jul. 1, 1988 [JP] Japan .................................. 63-162511

[51] Int. Cl.$^5$ .............................................. H01L 39/22
[52] U.S. Cl. .................................. 257/34; 257/36; 257/38; 257/39
[58] Field of Search ........................ 357/5, 71, 23.3; 257/31, 34, 36,

[56] References Cited

U.S. PATENT DOCUMENTS

| 4,647,954 | 3/1987 | Graf et al. ........................... 357/23.3 |
| 4,837,609 | 6/1989 | Gurvitch et al. ..................... 357/71 |
| 4,888,629 | 12/1989 | Harada et al. ........................ 357/5 |

FOREIGN PATENT DOCUMENTS

| 0181191 | 5/1986 | European Pat. Off. . |
| 60-142580 | 7/1985 | Japan ................................. 357/23.3 |
| 62-131588 | 6/1987 | Japan . |

OTHER PUBLICATIONS

Gorkov "The Type of Superconductivity in Bechgaard's Salts" *JETP* Lett. vol. 44, No. 11, Dec. 10, 1986, pp. 693–696.
Clark et al., "Feasibility of Hybrid Josephson FET's" Journal of Appl. Phys. vol. 51, No. 5, May 1980.
Ivanov et al., "Three Terminal Josephson-Junction with a Semiconductor Accumulation Layer" Jap. J. Appl. Phys. vol. 26, Suppl. 26-3, (1987) Proc. 18th Intnl. Conf. on Low Temp. Physics, Kyoto.
"Preparation of High $T_c$ Oxide superconducting Films by Laser Annealing" by Yonezawa et al., Solid State Devices and Materials, pp. 37–42 (1988).
Figs. 2 and 3 of EOP Application 0181191.
Japanese Journal of Applied Physics (Part 2) vol. 26, No. 3, 1987, pp. 1617–1618, Tokyo, Japan; Z. Ivanouv et al. "Three Terminal Josephson Junction with a Semiconductor Accumulation Layer"Fig. 2; p. 1617, par. 2
Patent Abstracts of Japan vol. 11 No. 355 (E-558)(2802) 19 Nov. 1987; & JP-A 62 131588 (Hitachi Ltd.) 13.06.1987.
"As-deposited Y-Ba-Cu-O superconducting films on silicon at 400° C." Appl. Phys. Lett. 54(6), Feb. 1989.

*Primary Examiner*—Sara W. Crane
*Attorney, Agent, or Firm*—Kenyon & Kenyon

[57] ABSTRACT

A superconducting field effect transistor which is very small in size and high in dimensional accuracy, has a first layer of material forming a control electrode and a second layer of another material is disposed on said first layer. A width of said first layer in a direction toward a superconducting source electrode and a superconducting drain electrode is narrower than a width of the second layer in the same direction. Polycrystalline silicon may be used as the control electrode while the second layer can be made of silicon nitride. Furthermore, a side surface of the control electrode may be coated with an insulator film. Accordingly, the above transistor has a fine structure gate electrode part that can be fabricated easily and accurately.

14 Claims, 6 Drawing Sheets

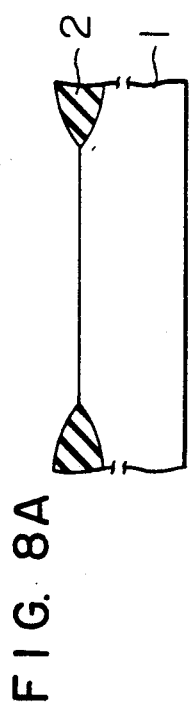
FIG. 8A
FIG. 8B
FIG. 8C
FIG. 8D
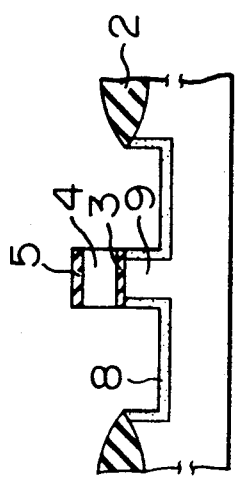
FIG. 8E
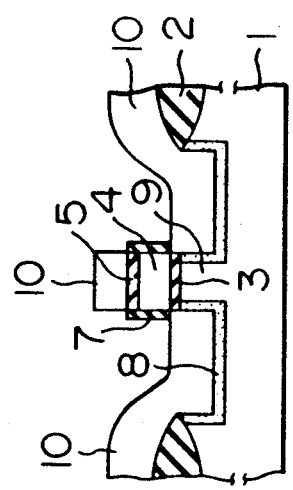
FIG. 8F
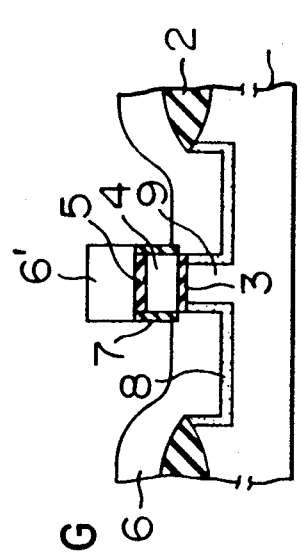
FIG. 8G

SUPERCONDUCTING FIELD EFFECT TRANSISTOR

This application is a continuation of application Ser. No. 07/800,736, filed on Dec. 3, 1991, abandoned, which was a continuation of application Ser. No. 07/687,771 filed on Apr. 19, 1991, abandoned which was a continuation of application Ser. No. 07/305,367 filed on Feb. 1, 1989, abandoned.

BACKGROUND OF THE INVENTION

The present invention relates to a field effect transistor, and more particularly to a superconducting field effect transistor which is very small in size and which is made of a semiconductive material and a superconducting material.

A superconducting field effect transistor is discussed in an article by Clark (Journal of Applied Physics, Vol. 51, 1980, page 2736).

In the above article, however, no attention is paid to the fact that the operation of circuits including superconducting field effect transistors is made unstable by certain variations in characteristics of superconducting field effect transistor due to the microfabrication of the gate electrode thereof.

SUMMARY OF THE INVENTION

The present invention provides a superconducting field effect transistor which is very small in size and high in dimensional accuracy, and provides a method of fabricating the above transistor.

According to a first aspect of the present invention, there is provided a superconducting field effect transistor which comprises: a semiconductor substrate; first and second impurity-doped regions formed in the semiconductor substrate; first and second superconducting electrodes formed on the semiconductor substrate; and a gate electrode formed over the semi-conductor substrate with an insulating film therebetween and further, being interposed between the first and second superconducting electrodes, the gate electrode being formed of a first layer. A second layer different in material from the first layer, is formed on the top of the first layer so that those side surfaces of the second layer which confront the first and second superconducting electrodes, protrude from those side surfaces of the first layer which confront the first and second superconducting electrodes. In other words, the second layer is extended in directions toward the first and second superconducting electrodes, and thus a control electrode part made up of the first and second layers has an overhang structure. The second may be extended in all directions parallel to the semiconductor substrate. The first layer serving as the control electrode is made of impurity-doped monocrystalline, polycrystalline or amorphous silicon. Alternatively, the first layer may be made of a silicon compound. Silicon nitride can be used to make the second layer. It is preferable that the first and second layers are made of poly-silicon and silicon nitride, respectively.

According to a second aspect of the present invention, there is provided a superconducting field effect transistor which comprises: a semiconductor substrate; first and second impurity-doped regions formed in the semiconductor substrate; first and second superconducting electrodes formed on the semiconductor substrate; and a gate electrode formed over the semiconductor substrate with a first insulating film therebetween and further being interposed between the first and second superconducting electrodes, a side surface of the gate electrode being coated with a second insulating film. It is preferable that the second insulating film is made of silicon nitride. Further, it is preferable to arrange the gate electrode and the first and second superconducting electrodes so that the gate electrode is isolated from the first and second superconducting electrodes by the second insulating film.

According to a third aspect of the present invention, there is provided a method of fabricating a superconducting field effect transistor which comprises the steps of: forming an insulating film on a desired region of a semiconductor substrate; piling first and second layers on the insulating film successively, the first layer being used for forming a gate electrode, the first layer being different in material from the second layer, the material of the first layer being more easily worked than the material of the second layer; working the first and second layers so that each of the first and second layers has a desired shape; forming first and second impurity-doped regions in the semiconductor substrate; and forming a superconducting electrode layer.

For example, the first and second layers are etched so that each of the first and second layers has a desired shape. Further, the first and second layers are made of poly-silicon and silicon nitride, respectively, because poly-silicon is more easily etched than silicon nitride. When first and second impurity-doped regions are formed through ion implantation techniques and heat treatment techniques, and when the superconducting electrode layer is formed by depositing a superconducting material such as Nb (niobium), the second layer serves as a mask. Accordingly, it is preferred to make the second layer of silicon nitride excellent in heat resistance.

In a field effect transistor utilizing a superconducting proximity effect, it is necessary to form first and second superconducting electrodes in close proximity to a gate electrode. In a superconducting field effect transistor according to the first aspect of the present invention, a gate electrode part has a laminate structure made up of the first and second layers, and the side surfaces of the first layer recede from the side surfaces of the second layer. The fabrication method according to the third aspect of the present invention can realize the recession of the side surface of the first layer. For example, the above recession can be controllably realized by the reactive ion etching method. Alternatively, the side surface of the first layer is oxidized, and then the oxide film thus formed is removed. In either case, the amount of recession of the side surface of the first layer can be readily controlled. In the above-mentioned gate electrode part, the second layer made of, for example, silicon nitride is made larger in width than the first layer made of, for example, polysilicon. When the gate electrode part having such a structure is used as a mask in depositing a superconducting material, first and second superconducting electrodes can be formed which are spaced apart from each other a distance corresponding to the width of the second layer. Moreover, the gate electrode (namely, the first layer) can be isolated from the first and second superconducting electrodes. Further, the second layer is used as a mask in forming the first and second impurity-doped regions by the ion implantation method. The gate electrode part made up of the first and second layers (for example, the poly-silicon layer and the silicon nitride layer) is not subjected to any change in shape and resistivity by the heat treatment carried out after the ion implantation. Accordingly, even after the formation of the first and second impurity-doped regions, first and second superconducting electrodes aligned with a fine gate electrode can be accurately formed. Thus, the dimensional accuracy of a superconducting field effect transistor is improved. Hence, in a case where two or more superconducting field effect transistors are formed, characteristics of the transistors vary only slightly. Accordingly, a circuit including superconducting field effect transistors according to the present invention will have a stable operation whereby even when a source voltage or ambient temperature varies the superconducting field effect transistors will each respond in a similar manner.

Further, in a superconducting field effect transistor according to the second aspect of the present invention, the side surface of a gate electrode is covered with an insulating film, for example, a silicon nitride film. When the thickness of this insulating film is reduced to about 5 nm, the distance between first and second superconducting electrodes decreases, but the gate electrode can be sufficiently insulated from the first and second superconducting electrodes. In other words, by covering the side surface of the gate electrode with the insulating film, the distance between the first and second superconducting electrodes can be set to a desired value without causing an electrical short between the gate electrode and the superconducting electrodes. Furthermore, the distance between the first and second superconducting electrodes is not affected by conditions under which the superconducting electrodes are deposited.

In order to operate a superconducting field effect transistor so that a sufficient superconducting current flows, it is desirable to form a superconducting weak link between the first and second superconducting electrodes through a semiconductor substrate, that is, it is desirable to make the distance between the first and second superconducting electrodes three to ten times larger than the superconducting coherence length in the semiconductor substrate. Even when the distance between the first and second superconducting electrodes is more than ten times the above superconducting coherence length, the superconducting field effect transistor can produce a favorable result.

In order to form the superconducting weak link in a superconducting field effect transistor using a silicon substrate, it is required to make the gate length (namely, the length of the gate electrode in the direction in which the gate electrode and the first and second superconducting electrodes are arranged) less than 0.3 $\mu$m, preferably, less than or equal to 0.15 $\mu$m.

In a superconducting field effect transistor according to the present invention, first and second superconducting electrodes are generally made of Nb. However, the material for making the superconducting electrodes is not limited to Nb. The superconducting electrodes may be made of other superconducting materials such as a niobium compound (for example, NbN), a Pb alloy, Al, In and Sn. Furthermore, the superconducting electrodes may be made of oxide superconducting materials such as $(La_{0.9}Sr_{0.1})_2 CuO_4$ and $YBa_2Cu_3O_{7-\delta}$ where O 0.5. In this case, the superconducting field effect transistor can be operated at a relatively high temperature (for example, a temperature higher than the boiling temperature of liquid nitrogen). The superconducting electrodes may be made of an organic superconducting material such as $(TMTSF)_2PF_6$ (TMTSF is Tetra Methyl Tetra Selena Fulvalen and $PF_6$ is phosphorous fluoride).

In a superconducting field effect transistor according to the second aspect of the present invention, it is desirable to make the distance between first and second superconducting electrodes equal to the sum of the width of a gate electrode and the resultant thickness of the second insulating film formed on both sides of the gate electrode. That is, it is desirable to form the first and second superconducting electrodes so that each of the first and second superconducting electrodes is kept in contact with the second insulating film. Further, it is desirable that the second insulating film formed on the side surface of the gate electrode is made of materials such as silicon nitride, YSZ (yttrium stabilized zirconia), aluminum oxide, MgO, yttrium oxide and silicon oxide.

When a superconducting field effect transistor according to the second aspect of the present invention is fabricated, it is desirable to form a second insulating film on the side surface of a gate electrode prior to the deposition of the first and second superconducting electrodes. It is preferable to insulate between the first and second superconducting electrodes. For examples, it is preferable to chemically remove a superconducting layer which is formed over the gate electrode when the first and second superconducting electrodes are deposited, without removing the first and second superconducting electrodes.

BRIEF DESCRIPTION OF THE DRAWINGS

FIGS. 8A to 8G are sectional views showing fabrication steps of the fifth embodiment of FIG. 6.

DETAILED DESCRIPTION

Figure 1:
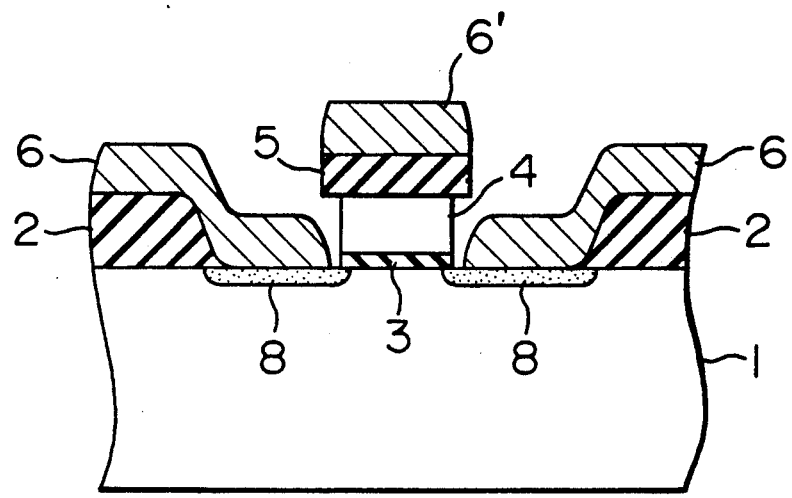
FIG. 1 is a sectional view showing a first embodiment of a superconducting field effect transistor according to the present invention.

FIG. 1 is a sectional view showing a first embodiment of the present invention. Referring to FIG. 1, a (100)-oriented silicon single crystal substrate which contains boron at a concentration of $1 \times 10^{16}$ cm$^{-3}$, is put in an atmosphere of oxygen kept at about 1,000° C., to oxidize the surface of the substrate 1, thereby forming an insulating film (namely, $SiO_2$ film) 2 having a thickness of about 200 nm. Then, the insulating film 2 is etched by a chemical etching method, in accordance with a photoresist pattern used as a mask. Next, an oxide film 3 made of $SiO_2$ and having a thickness of about 10 nm is formed on the substrate 1 by thermal oxidation which is carried out in an atmosphere of oxygen kept at about 950° C. Then, a poly-silicon layer (that is, first layer) 4 which will be used for forming a gate electrode, is deposited by the CVD (chemical vapor deposition) method to a thickness of about 100 nm, and a large amount of phosphorus is diffused into the first layer 4. Next, a silicon nitride layer (that is, second layer) 5 is deposited on the first layer 4 to a thickness of about 50 nm. Then, a resist pattern made of a negatype electron beam resist material is formed by electron beam lithography, and the silicon nitride layer 5 and the poly-silicon layer 4 are etched in accordance with the above resist pattern used as a mask, by the reactive ion etching method using $CF_4$ gas. Next, thermal oxidation is again carried out in an atmosphere of oxygen kept at about 950° C., to oxidize the side surface of the polysilicon layer 4 which has been etched, thereby forming an oxide film having a thickness of about 15 nm. The thickness of this oxide film can be readily set to a desired value by changing the thermal oxidation time. Thereafter, arsenic ions are implanted into the substrate 1 at an accelerating voltage of 25 KV and at a dose rate of $5 \times 10^{14} cm^{-2}$. Then the substrate 1 is annealed at 850° C. in an atmosphere of pure nitrogen for 10 minutes, to complete impurity-doped regions 8. The impurity content of the impurity-doped regions 8 is selected to avoid the freeze-out of carriers at a time the present embodiment is cooled to the operation temperature thereof. In the case where a superconducting electrode is made of Nb and the present embodiment is operated at the liquid helium temperature, the impurity concentration of the regions 8 is chosen in the range from $5 \times 10^{18} cm^{-3}$ to $1 \times 10^{20} cm^{-3}$. In the case where the superconducting electrode is made of an oxide superconducting material and the present embodiment is operated at the liquid nitrogen temperature, the impurity concentration of the regions 8 is chosen in the range from $5 \times 10^{17} cm^{-3}$ to $1 \times 10^{20} cm^{-3}$. The oxide film formed on the side surface of the poly-silicon layer 4 is removed by the chemical etching method. Thus, as shown in FIG. 1, the silicon nitride layer 5 is disposed on the top of the poly-silicon layer 4 in a state that the width of the silicon nitride layer 5 is larger than that of the poly-silicon layer 4. That is, a gate electrode part having an overhang structure is formed. Thereafter, niobium is deposited on the substrate 1 having the formed gate electrode part, in a high vacuum of $1 \times 10^{-7}$ Pa by the electron beam evaporation method, to form a superconducting electrode layer 6 having a thickness of about 100 nm. Finally, an unnecessary portion of the niobium layer is removed in accordance with a photoresist pattern used as a mask, by a reactive ion etching method, to obtain the present embodiment. Incidentally, reference symbol 6' in FIG. 1 designates a niobium layer formed over the gate electrode 4. The niobium layer 6' may be regarded as a portion of the gate electrode part, or may be removed. In an ordinary case, a plurality of superconducting field effect transistors are formed on the substrate 1, and the transistors are connected with each other by a wiring conductor connected to the superconducting electrode layer 6, to form a desired circuit.

In the present embodiment, the superconducting electrode layer 6 is made of niobium. Alternatively, the superconducting electrode 6 may be made of one of a group consisting of a niobium compound such as NbN, a Pb alloy, aluminum, indium tin, an aluminum alloy, an indium alloy and a tin alloy. Furthermore, an oxide superconducting material or organic superconducting material may be used to make the superconducting electrode layer 6. In a case where the superconducting electrode layer 6 is made of $(La_{0.9}Sr_{0.1})_2 CuO_4$ or $YBa_2Cu_3O_{7-\delta}$, the present embodiment can be operated at a relatively high temperature, without failing to obtain the advantage of the present invention.

Figure 2:
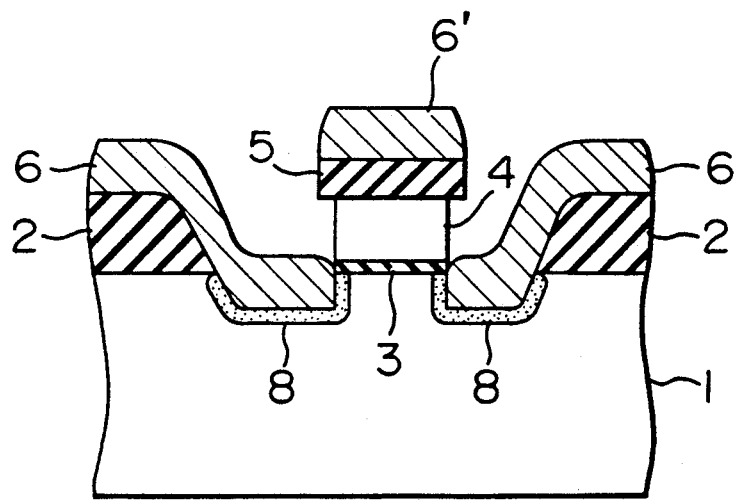
FIG. 2 is a sectional view showing a second embodiment of a superconducting field effect transistor according to the present invention.
Figure 5A:
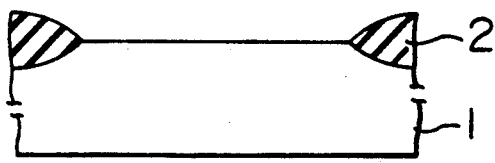
FIGS. 5A to 5E are sectional views showing fabrication steps of the third embodiment of FIG. 3.
Figure 5B:
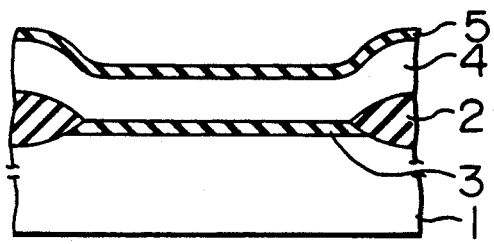
Figure 5C:
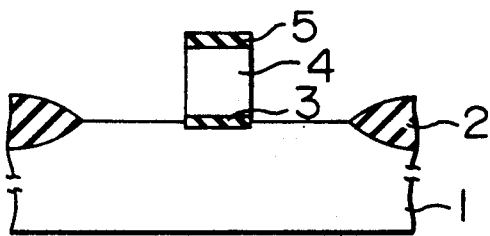
Figure 5D:
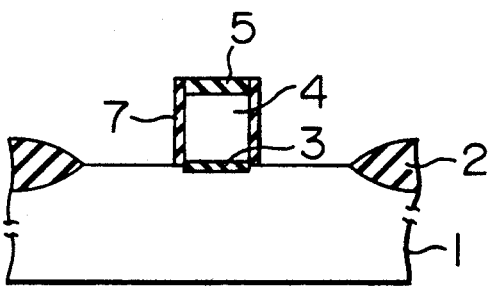
Figure 9:
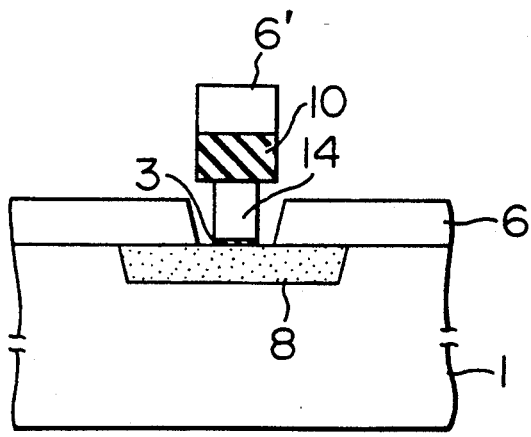
FIG. 9 is a sectional view showing a fabrication step of a conventional cryogenic tunneling transistor.

An overhang structure similar to the overhang structure of the gate electrode part may appear in the fabrication step of a conventional semiconductor element or superconducting element. For example, FIG. 9 is a sectional view which shows a fabrication step of a cryogenic tunneling transistor and is depicted in FIG. 5D of a Japanese Laid-Open Patent Publication JP-A-60-142,580. It is to be noted that the element of FIG. 9 utilizes the tunnel effect, and includes a single impurity-doped region 8. Furthermore, in the present embodiment, the overhang structure of the gate electrode part is formed of the polysilicon layer 4 and the silicon nitride layer 5. While, in the element of FIG. 9, an overhang structure is formed of a niobium gate electrode 14 and a resist layer 10. The resist layer 10 cannot be used as a mask for ion implantation. Accordingly, in the element of FIG. 9, the impurity-doped region 8 is formed prior to the formation of the gate electrode 10. Moreover, the resist layer 10 and a niobium layer 6' are both removed in a subsequent step. As is evident from the above, the element of FIG. 9 is entirely different from the embodiment FIG. 1. FIG. 2 is a sectional view showing second embodiment of the present invention. Referring to FIG. 2, a (100)-oriented silicon single crystal substrate 1 which contains boron at a concentration of $1 \times 10^{15} cm^{-3}$, is put in an atmosphere of oxygen kept at about 1,000° C., to oxidize the surface of the substrate 1, thereby forming an insulating film (namely, $SiO_2$ film) 2 having a thickness of about 200 nm. Then, the insulating film 2 is etched by a chemical etching method, in accordance with a photoresist pattern used as a mask. Next, an oxide film 3 made of $SiO_2$ and having a thickness of about 10 nm is formed on the substrate 1 by thermal oxidation which is carried out in an atmosphere of oxygen kept at about 950° C. Then, a poly-silicon layer (that is, first layer) 4 is deposited by the CVD method to a thickness of about 100 nm, and a silicon nitride layer (that is, second layer) 5 is deposited on the poly-silicon layer 4 to a thickness of about 50 nm. Then, a resist pattern made of a nega-type electron beam resist material is formed by electron beam lithography. The silicon nitride layer 5, the poly-silicon layer 4 and the oxide film 3 are etched in accordance with the above resist pattern used as a mask, by the reactive ion etching method using $CF_4$ gas. Furthermore, the substrate 1 is etched to a depth of about 100 nm. Next, the exposed surfaces of the substrate 1 and poly-silicon layer 4 are oxidized by thermal oxidation in an atmosphere of oxygen, so as to form a silicon oxide film having a thickness of about 10 nm. Thereafter, arsenic ions are implanted into substrate 1 at an accelerating voltage of 25 KV and at a dose rate of $5 \times 10^{14} cm^{-2}$. Then the substrate 1 is annealed at 850° C. in an atmosphere of pure nitrogen for ten minutes, to activate arsenic atoms in the substrate 1, thereby completing impurity-doped regions 8. Then, the silicon oxide film which has been formed on the exposed surfaces of the substrate 1 and poly-silicon layer 4, is removed by dilute fluoric acid which contains 1 part of fluoric acid and 100 parts of water. Thereafter, niobium is deposited on the substrate 1 having the poly-silicon layer 4 and the silicon nitride layer 5, by an electron beam evaporation method, to a thickness of about 100 nm. The niobium film thus formed is etched in accordance with a photoresist pattern used as a mask, by the reactive ion etching method using $CF_4$ gas, to form superconducting electrodes 6. Thus, the present embodiment having the structure of FIG. 2 is obtained.

The present embodiment is different from the first embodiment of FIG. 1 in that the substrate 1 has a protrusion 9 made of the same material as used for making the substrate 1, and the protrusion 9 substantially acts as a channel region. Accordingly, the gate electrode (that is, poly-silicon layer) for controlling the carrier density of the channel region is formed over the protrusion 9 with the oxide film 3 between the gate electrode 4 and the protrusion 9. In the present embodiment, as shown in FIG. 2, a source region, the channel region and a drain region are formed at the same level, and thus a superconducting current can flow efficiently. That is, the present embodiment is advantageous in that the superconducting proximity effect is enhanced.

Figure 3:
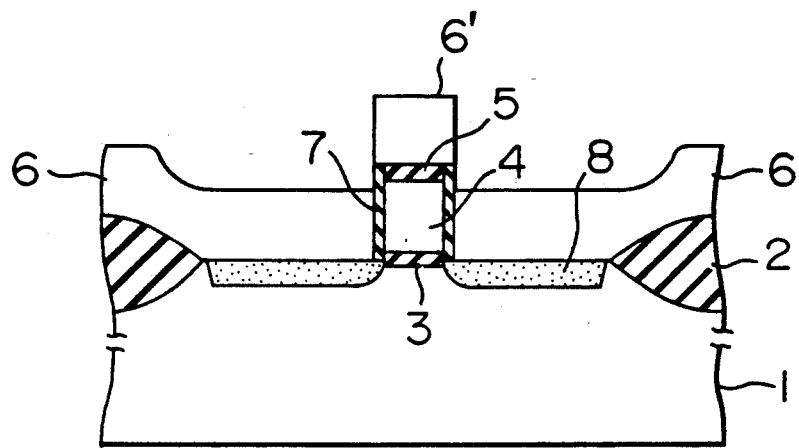
FIG. 3 is a sectional view showing a third embodiment of a superconducting field effect transistor according to the present invention.

FIG. 3 is a sectional view showing a third embodiment of the present invention.

Referring to FIG. 3, an insulating film 2 for isolating elements from each other, is formed on a substrate 1, and first and second superconducting electrodes 6 are so formed on the substrate 1 as to be disposed on both sides of a gate electrode 4, to be used as source and drain electrodes. The distance between the first and second superconducting electrodes 6 is selected so that the superconducting proximity effect is generated, that is, is made less than a value which is ten times larger than the coherence length in the substrate 1. When the distance between the superconducting electrodes is made greater than the above value, electron waves corresponding to an electron pair which is diffused from the two superconducting electrodes into the substrate, are not readily coupled with each other, and thus the superconducting current will not flow. Such a state is not favorable to the present embodiment. Referring back to FIG. 3, the gate electrode 4 made of poly-silicon for controlling a superconducting current which flows between the first and second conducting electrodes 6 through the substrate 1, is formed over the substrate 1 with a gate oxide film (that is, first insulating film) 3 between the gate electrode and the substrate. Further, a silicon nitride layer 5 which acts as a mask when source and drain regions are formed through ion implantation techniques, is formed on the top of the gate electrode 4, and the side surface of the gate electrode 4 is covered with a silicon nitride film (that is, second insulating film) 7 for insulating the gate electrode 4 from the source and drain electrodes 6. It is desirable to make the thickness of the second insulating film 7 as small as possible. In more detail, the gate length of the present embodiment is equal to the sum of the width of the gate electrode 4 and the resultant thickness of the second insulating film 7 formed on both sides of the gate electrode, and hence the superconducting proximity effect can be enhanced by reducing the thickness of the second insulating film 7. Furthermore, those regions of the substrate 1 which exist beneath the first and second superconducting electrodes 6, are doped with an impurity, to form impurity-doped regions 8. The impurity content of the impurity-doped regions 8 is chosen to avoid the freeze-out of carriers at a time the present embodiment is cooled to the operation temperature thereof.

When a voltage is applied to the gate electrode 4 to accumulate carriers in a channel region, that portion of the substrate 1, into which electron pairs from the superconducting electrodes 6 are diffused, is enlarged, and thus the superconducting current flowing between the first and second superconducting electrodes (namely, source and drain electrodes) is increased.

Next, a method of fabricating the present embodiment will be explained, with reference to FIGS. 5A to 5E.

First, a (100)-oriented silicon single crystal substrate 1 which contains boron at a concentration of $1 \times 10^{16} cm^{-3}$ is put in an atmosphere of oxygen kept at about 1,000° C., to oxidize the surface of the substrate 1, thereby forming an insulating film (namely, $SiO_2$ film) having a thickness of about 200 nm. Then, the insulating film 2 is etched by a chemical etching method, in accordance with a photoresist pattern used as a mask (FIG. 5A). Next, a gate oxide film (that is, first insulating film) 3 made of $SiO_2$ and having a thickness of about 10 nm is formed on the substrate 1 by thermal oxidation which is carried out in an atmosphere of oxygen kept at about 950° C. Then, a poly-silicon layer 4 which will be used for forming a gate electrode, is deposited by the CVD method to a thickness of about 100 nm, and a large amount of phosphorus is diffused into the poly-silicon layer 4. Next, a silicon nitride layer 5 is deposited on the poly-silicon layer 4 to a thickness of about 50 nm (FIG. 5B). Then, a resist pattern made of a nega-type electron beam resist material is formed by electron beam lithography, and the silicon nitride layer 5 and the poly-silicon layer 4 are etched in accordance with the above resist pattern used as a mask, by the reactive ion etching method using $CH_2F_2$ gas and the reactive ion etching method using $CCl_4$ gas respectively (FIG. 5C). Next, the silicon nitride film (that is, second insulating film) 7 is deposited by the CVD method to a thickness of 5 nm, and then the silicon nitride film formed on the surface of the substrate 1 is removed by the reactive ion etching method using $CH_2F_2$ gas. Further, an $SiO_2$ film left on the substrate surface is removed by the chemical etching method using HF, to expose a clean surface of the substrate 1 (FIG. 5D).

Thereafter, arsenic ions are implanted into the substrate 1 at an accelerating voltage of 25 KV and at a dose rate of $5 \times 10^{14} cm^{-2}$, and then the substrate 1 is annealed at 850° C. in an atmosphere of pure nitrogen for ten minutes, to complete impurity-doped regions 8.

Figure 5E:
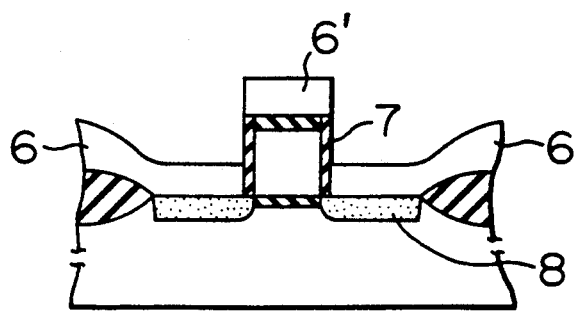

Next, niobium is deposited all over the surface in a high vacuum of $1 \times 10^{-7}$ Pa by the electro beam evaporation method, to form a superconducting electrode layer 6 having a thickness of about 100 nm (FIG. 5E). Finally, an unnecessary portion of the superconducting electrode layer 6 is removed in accordance with a photoresist pattern used as a mask, by a reactive ion etching method, to obtain the present embodiment. In most cases, a plurality of superconducting field effect transistors are formed on the same substrate. In the above cases, the superconducting field effect transistors are connected with each other by a wiring conductor connected to the superconducting electrode layer 6.

In the present embodiment, the superconducting electrode layer 6 is made of niobium. However, the material of the layer 6 is not limited to niobium, but the layer 6 may be made of a superconducting alloy which has been already mentioned, an oxide superconducting material, or an organic superconducting material.

In the present embodiment, as shown in FIG. 3, a superconducting layer (namely, niobium layer) 6' is left on the top of the silicon nitride layer 5. When the superconducting layer 6' is removed, the source and drain electrodes will surely be electrically isolated from the gate electrode. The superconducting layer 6' can be removed by various methods. For example, the silicon nitride layer 5 may be peeled from the poly-silicon layer 4 in hot phosphoric acid kept at about 160° C. Alternatively, a polymer is applied to the surface of the present embodiment so as to form a flat surface, and then the superconducting layer 6' is removed by the etch-back method. Further, an aluminum layer may be formed beneath the silicon nitride layer 5 to remove the superconducting layer by the lift-off method.

According to the present embodiment, the superconducting electrodes can be formed so as to be kept in contact with the insulating film on the side surface of the gate electrode, and hence the distance between the superconducting electrodes can be set to a desired value without generating an electrical breakdown between the gate electrode and the superconducting electrodes. The above distance is scarcely affected by conditions under which the superconducting electrodes are formed. Hence, the present embodiment is excellent in reproducibility.

In a case where the insulating film 7 on the side surface of the gate electrode is made of silicon nitride, even if the thickness of the insulating film 7 is made less than 5 nm, the gate electrode 4 will be surely insulated from the superconducting electrodes. Hence, the insulating film 7 made of silicon nitride can be used even when the gate electrode is made very small in size. Alternatively, the insulating film 7 may be made of $SiO_2$, $SiO$, $Al_2O_3$, YSZ (yttrium stabilized zirconia), MgO, or yttrium oxide. Further, the insulating film 7 may be formed of the self-oxidation film of the gate electrode. The impurity-doped regions 8 are formed by using the silicon nitride layer 5 as a mask, and hence it is possible to make the channel length short. Accordingly, it is possible to increase the switching speed of the present embodiment and to improve the mutual conductance thereof, without generating a punch through effect.

Figure 4:
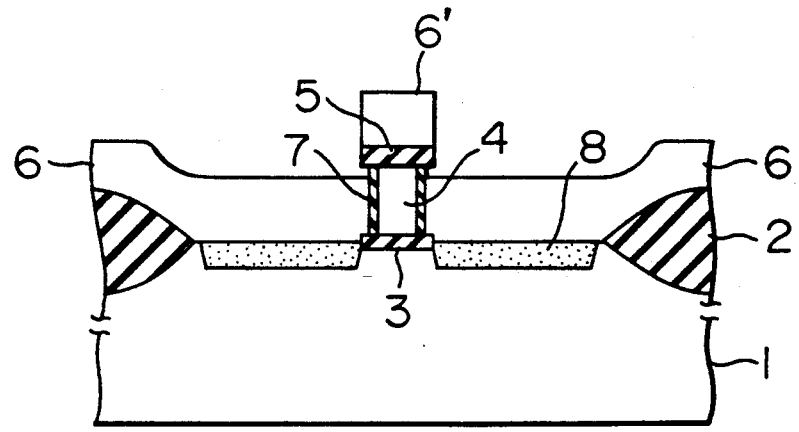
FIG. 4 is a sectional view showing a fourth embodiment of a superconducting field effect transistor according to the present invention.
Figure 10A:
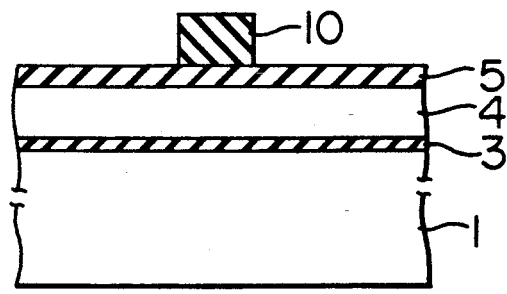
FIGS. 10A to 10D are sectional views which show fabrication steps of an overhang structure depicted in FIGS. 4 and 7.
Figure 10B:
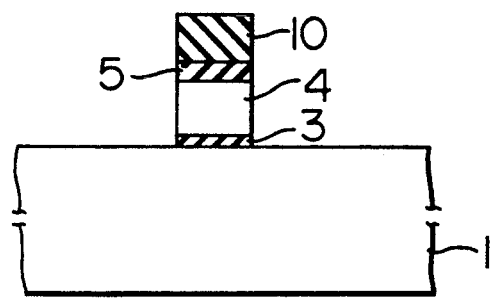
Figure 10C:
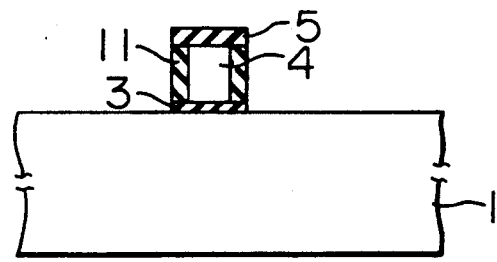
Figure 10D:
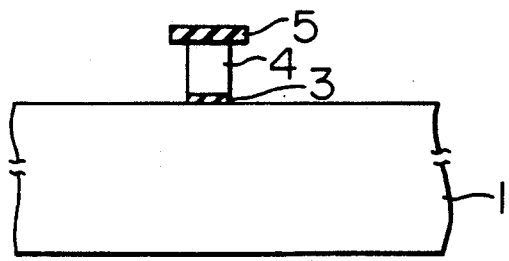

FIG. 4 is a sectional view showing a fourth embodiment of the present invention. Referring to FIG. 4, a gate electrode 4 is interposed between first and second superconducting electrodes 6 corresponding to source and drain electrodes, in such a manner that a silicon nitride film (that is, second insulating film) 7 is sandwiched between the gate electrode 4 and the first or second superconducting electrode 6. The present embodiment, however, is different from the third embodiment of FIG. 3 in that the side surface of a silicon nitride layer 5 formed on the top of the gate electrode 4 protrudes from the surface of the silicon nitride film 7 formed on the side surface of the gate electrode 4, and thus a gate electrode part has an overhang structure. Accordingly, the present embodiment and the third embodiment can be fabricated in the same manner, except that a method of fabricating the present embodiment includes a step of forming the overhang structure of the gate electrode part. The step of forming the overhang structure which is included in the present embodiment, is substantially the same as a step of forming the overhang structure which is included in the first embodiment of FIG. 1. Now, the overhang-structure forming step will be explained below, with reference to FIGS. 10A to 10D. As shown in FIG. 10A, a resist pattern 10 made of a nega-type electron beam resist material is formed by electron beam lithography. Then, a silicon nitride layer 5 and a poly-silicon layer 4 are etched in accordance with the resist pattern 10 used as a mask, by the reactive ion etching method using $CH_2F_2$ gas and the reactive ion etching method using $CCl_4$ gas, respectively (FIG. 10B). Next, thermal oxidation of silicon is carried out in an atmosphere of oxygen kept at about 1,100° C., to form an oxide film 11, having a thickness of about 15 nm, on the side surface of the poly-silicon layer 4 which has been etched in accordance with the resist pattern 10 (FIG. 10C). The thickness of the oxide film 11 can be readily controlled by varying the oxidation time. The oxide film 11 is removed by the chemical etching method using HF, and hence the side surface of the poly-silicon layer 4 recedes from the side surface of the silicon nitride layer 5. Thus, the overhang structure is formed as shown in FIG. 10D.

In the present embodiment, the first and second superconducting electrodes 6 are made of niobium. Alternatively, the superconducting electrodes 6 may be made of one of other superconducting materials which have been already mentioned.

Furthermore, in the present embodiment, when the gate electrode part having an overhang structure is formed, the side surface of the poly-silicon layer is first oxidized by thermal oxidation to form a silicon oxide film. In order to make uniform the thickness of the silicon oxide film, it is desirable to oxidize the side surface of the poly-silicon layer in an atmosphere of oxygen kept at 1,000° C. or more.

In the present embodiment, as shown in FIG. 4, a superconducting layer 6' is left on the top of the silicon nitride layer 5. When the superconducting layer 6' is removed, the superconducting electrodes 6 will surely be electrically isolated from the gate electrode 4. The superconducting layer 6' can be removed by various methods. For example, the silicon nitride layer 5 may be peeled from the poly-silicon layer 4 in hot phosphoric acid kept at about 160° C. Alternatively, a polymer is applied to the surface of the present embodiment so as to form a flat surface, and then the superconducting layer 6' is removed by the etch-back method. Further, an aluminum layer may be formed beneath the silicon nitride layer 5, to remove the superconducting layer 6' by the lift-off method.

The present embodiment is excellent in electrical insulation between the gate electrode and the superconducting electrodes, and can produce a high gain.

Furthermore, according to the present embodiment, it is not required to satisfy evaporation conditions strictly, and thus the manufacturing yield is improved.

Figure 6:
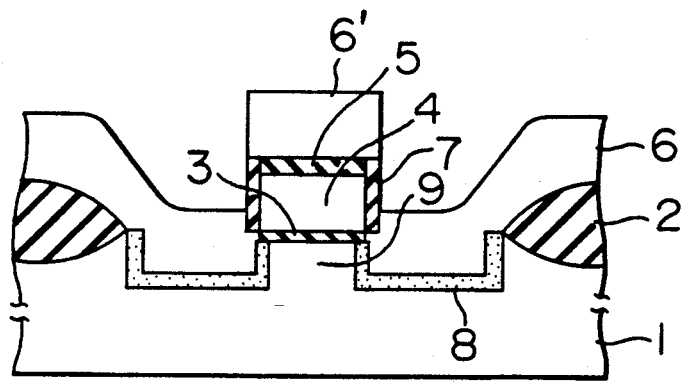
FIG. 6 is a sectional view showing a fifth embodiment of a superconducting field effect transistor according to the present invention.

FIG. 6 is a sectional view showing a fifth embodiment of the present invention, and FIGS. 8A to 8G are sectional views showing fabrication steps of the fifth embodiment. Referring to FIG. 6, a substrate 1 has a protrusion 9 made of the same material as used for making the substrate 1, and the protrusion 9 substantially acts as a channel region. A gate electrode 4 made of poly-silicon for controlling the carrier density of the channel region is formed over the substrate 1 with a gate oxide film between the substrate and the gate electrode.

First and second superconducting electrodes 6 are formed on both sides of each of the protrusion 9 and the gate electrode 4. The first and second superconducting electrodes 6 correspond to source and drain electrodes, respectively. When a voltage is applied to the gate electrode 4 to accumulate carriers from impurity-doped regions 8 in the channel region, that portion of the substrate 1 into which electron pairs from the superconducting electrodes 6 are diffused, is enlarged, and thus the superconducting current flowing between the first and second superconducting electrodes (that is, source and drain electrodes) is increased.

In the present embodiment, a source region, the channel region and a drain region are formed at the same level, and hence the above superconducting current can flow efficiently. However, the distance between the source and drain electrodes is determined by the width of of the protrusion 9 and the width of the gate electrode 4, and is required to be less than ten times the coherence length in the substrate 1. Accordingly, in the present embodiment, the gate electrode 4 is made small inside, and the size surface of the gate electrode 4 is electrically insulated from the source and drain electrodes.

Now, a method of fabricating the present embodiment will be explained, with reference to FIGS. 8A to 8G. A (100)-oriented silicon single crystal substrate 1 which contains boron at a concentration of $1 \times 10^{15} cm^{-3}$ is put in an atmosphere of oxygen kept at about 1,000° C., to oxidize the surface of the substrate 1, thereby forming an insulating film (that is, $SiO_2$ film) 2 having a thickness of about 200 nm. Then, the insulating film 2 is etched by a chemical etching method, in accordance with a photoresist pattern used as a mask (FIG. 8A). Next, a gate oxide film 3 made of $SiO_2$ and having a thickness of about 10 nm is formed on the substrate 1 by thermal oxidation which is carried out in an atmosphere of pure oxygen kept at about 950° C. (FIG. 8B). Then, a poly-silicon layer 4 is deposited by the CVD method to a thickness of about 100 nm, and a silicon nitride layer 5 is deposited on the poly-silicon layer 4 to a thickness of about 50 nm (FIG. 8C). Next, a resist layer made of a nega-type electron beam resist material is formed by electron beam lithography. The silicon nitride layer 5, the poly-silicon layer 4 and the gate oxide film 3 are etched in accordance with the above resist pattern used as a mask, by the reactive ion etching method using $CF_4$ gas. Furthermore, the substrate 1 is etched in accordance with the above resist pattern to a depth of about 100 nm (FIG. 8D). Next, the exposed surfaces of the substrate 1 and the poly-silicon layer 4 are oxidized by thermal oxidation which is carried out in an atmosphere of pure oxygen, so as to form an oxide film having a thickness of about 10 nm. Thereafter, arsenic ions are implanted into the substrate 1 at an accelerating voltage of 25 KV and at a dose rate of $5 \times 10^{14} cm^{-2}$, and then the substrate 1 is annealed at 850° C. in an atmosphere of pure nitrogen for ten minutes, to activate arsenic atoms in the substrate 1, thereby completing impurity-doped regions 8 (FIG. 8E).

Next, a resist layer 10 is formed on the surface of the structure of FIG. 8E to a thickness of about 100 nm corresponding to the etching depth, and then a silicon nitride film 7 is deposited on the side surface of the poly-silicon layer 4 by the CVD method to a thickness of 5 nm (FIG. 8F). The resist layer 10 is removed by immersing the structure of FIG. 8F in acetone, and then an $SiO_2$ film formed on the substrate 1 is removed by dilute fluoric acid which contains 1 part of fluoric acid and 100 parts of water, to expose a clean surface of the substrate 1. Then, niobium is deposited by the electron beam evaporation method to a thickness of about 100 nm, to form a superconducting film (FIG. 8G). The superconducting film is etched in accordance with a photo-resist pattern used as a mask, by the reactive ion etching method using $CF_4$ gas. Thus, the present embodiment having the structure of FIG. 6 is obtained.

In the present embodiment, as shown in FIG. 6, the superconducting electrodes 6 and the channel region are formed at the same level. Hence, the present embodiment is advantageous in that the superconducting proximity effect is enhanced.

In the present embodiment, the superconducting electrodes 6 are made of niobium. However, the material for making the superconducting electrodes is not limited to niobium, but other superconducting materials can be used in place of niobium. Furthermore, as shown in FIG. 6, a superconducting layer 6' is left on the top of the silicon nitride layer 5. When the superconducting layer 6' is removed, the gate electrode will surely be electrically isolated from the source and drain electrodes.

Figure 7:
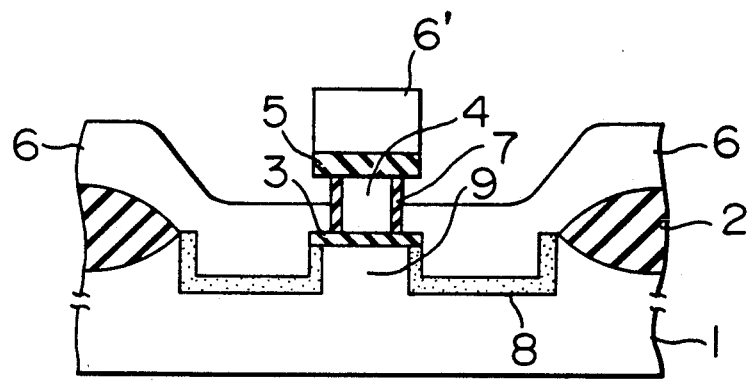
FIG. 7 is a sectional view showing a sixth embodiment of a superconducting field effect transistor according to the present invention.

FIG. 7 is a sectional view showing the a sixth embodiment of the present invention. Referring to FIG. 7, the surface of a silicon nitride film 7 formed on the side surface of a gate electrode 4 recedes from a nitride layer 5 formed on the top of the gate electrode 4, that is, a gate electrode part has an overhang structure. The overhang structure can be fabricated by the method which has been already mentioned with reference to FIGS. 10A to 10D.

Next, a method of fabricating the present embodiment will be explained below. Referring again to FIG. 7, a (100)-oriented silicon single crystal substrate 1 which contains boron at a concentration of $1 \times 10^{15} cm^{-3}$, is put in an atmosphere of oxygen kept at about 1,000° C., to oxidize the surface of the substrate 1, thereby forming an insulating film (that is, $SiO_2$ film) 2 having a thickness of about 200 nm. Then, the insulating film 2 is etched by a chemical etching method in accordance with a photoresist pattern used as a mask. Next, an oxide film 3 made of $SiO_2$ and having a thickness of about 10 nm is formed on the substrate 1 by thermal oxidation which is carried out in an atmosphere of pure oxygen kept at about 950° C. Then, a poly-silicon layer 4 is deposited by the CVD method to a thickness of about 100 nm, and a silicon nitride layer 5 is deposited on the poly-silicon layer 4 to a thickness of about 50 nm. Next, a resist pattern made of a nega-type electron beam resist material is formed by electron beam lithography. The silicon nitride layer 5, the poly-silicon layer and the oxide film 3 are etched in accordance with the above resist pattern used as a mask, by the reactive ion etching method using $CF_4$ gas. Thereafter, the substrate 1 is etched in accordance with the above resist pattern to a depth of about 100 nm. Next, the exposed surfaces of the substrate 1 and the poly-silicon layer 4 are oxidized by thermal oxidation which is carried out in an atmosphere of pure oxygen kept at 1,100° C., so as to form a surface oxide film having a thickness of 10 nm. Thereafter, arsenic ions are implanted into the substrate 1 at an accelerating voltage of 25 KV and at a dose rate of $5 \times 10^{14} cm^{-2}$, and then the substrate 1 is annealed at 850° C. in an atmosphere of pure nitrogen for ten minutes, to activate arsenic atoms in the substrate 1, thereby completing impurity-doped regions 8. Then, the above-mentioned surface oxide film are removed by dilute fluoric acid which contains 1 part of fluoric acid and 100 parts of water, to form the overhang structure of gate electrode part.

Next, a resist layer having a thickness of about 100 nm is formed all over the surface, to fill the etched portion of the substrate 1 with the resist layer, and then silicon nitride is deposited on the side surface of the poly-silicon layer 4 so as to form a silicon nitride film 7 having a thickness of 5 nm. The resist layer is removed by immersing it in acetone. An SiO₂ film which is formed on the surface of the substrate 1 by the above processing, is removed by fluoric acid diluted with water, to expose a clean surface of the substrate 1. Thereafter, niobium is deposited all over the surface by the electron beam evaporation method, so as to form a superconducting layer having a thickness of about 100 nm. The superconducting layer is etched in accordance with a photoresist pattern used as a mask, by the reactive ion etching method using CF₄ gas, to form superconducting electrodes. Thus, the present embodiment having the structure of FIG. 7 can be obtained.

In the present embodiment, the superconducting electrodes 6 and a channel region (that is, a protrusion 9) are formed at the same level, and hence the superconducting proximity effect is enhanced. Further, the gate electrode is electrically insulated from the source and drain electrodes (that is, superconducting electrodes) by the silicon nitride film 7, and hence variations in microfabrication will not cause a deterioration in device characteristics nor generate a malfunction.

In the present embodiment, the superconducting electrodes 6 are made of niobium. However, a material for making the superconducting electrodes 6 is not limited to niobium, but various superconducting materials which have been already mentioned, can be used in place of niobium.

Furthermore, in the present embodiment, when the gate electrode part having an overhang structure is formed, the side surface of the poly-silicon layer is first oxidized by thermalation oxidation to form a silicon oxide film. In order to make uniform the thickness of the silicon oxide film, it is desirable to oxidize the side surface of the poly-silicon layer in an atmosphere of oxygen kept at 1,100° C. or more.

In the present embodiment, as shown in FIG. 7, a superconducting layer (that is, niobium layer 6' is left on the top of the silicon nitride layer 5. When the superconducting layer 6' is removed, the gate electrode will surely be electrically isolated from the source and drain electrodes.

According to the present embodiment, the superconducting electrodes can be formed so as to be kept in contact with the insulating film on the side surface of the gate electrode, and hence the distance between the superconducting electrodes can be set to a desired value without generating an electrical breakdown between the gate electrode and the superconducting electrodes. The above distance is scarcely affected by conditions under which the superconducting electrodes are formed. Hence, the present embodiment is excellent in reproducibility.

As has been explained in the foregoing, according to the present invention, the microfabrication of gate electrode is readily and accurately carried out, and hence the manufacturing yield of superconducting field effect transistor and the dimensional accuracy of channel length are improved. Thus, a superconducting field effect transistor can be obtained which is excellent in reproducibility and quality.

We claim:

1. A superconducting field effect transistor comprising;
   a semiconductor substrate;
   first and second impurity-doped regions formed in the semiconductor substrate;
   first and second superconducting electrodes formed on the semiconductor substrate, said first superconducting electrode being in contact with said first impurity-doped region and said second superconducting electrode being in contact with said second impurity-doped region; and
   a gate electrode formed over a region of the semiconductor substrate between said first and second impurity-doped regions with an insulating film therebetween, said gate electrode interposed between said first and second superconducting electrodes, the gate electrode being formed of a first layer, and a second layer, different in material from the first layer formed on the top of the first layer, wherein side surfaces of said second layer which are opposite said first and second superconducting electrodes, extend further along a distance between said first and second superconducting electrodes, than side surfaces of the first layer which are opposite the first and second superconducting electrodes.

2. A superconducting field effect transistor according to claim 1, wherein a distance between said first and second superconducting electrodes is made three to ten times larger than the coherence length in the semiconductor substrate, to establish a superconducting weak link between said first and second superconducting electrodes through said semiconductor substrate.

3. A superconducting field effect transistor according to claim 1, wherein said first and second superconducting electrodes are made of niobium.

4. A superconducting field effect transistor according to claim 1, wherein the gate length of said gate electrode of the superconducting field effect transistor is in the range of 0.05 to 0.15 μm.

5. A superconducting field effect transistor, comprising:
   a semiconductor substrate;
   first and second impurity-doped regions formed in the semiconductor substrate;
   first and second superconducting electrodes formed on the semiconductor substrate;
   a gate electrode formed over a region of the semiconductor substrate, with an insulating film therebetween, said gate electrode being interposed between said first and second superconducting electrodes, the gate electrode being formed of a first layer of a first material, and a second layer, different in material from the first layer formed on top of said first layer, wherein side surfaces of said second layer which oppose said first and second superconducting electrodes extend further along a distance between said first and second superconducting electrodes than side surfaces of said first layer which oppose said first and second superconducting electrodes;
   wherein said first material is poly-silicon, and said second material is silicon nitride.

6. A superconducting field effect transistor, comprising
   a semiconductor substrate;

first and second impurity-doped regions formed in the semiconductor substrate;

first and second superconducting electrodes formed on the semiconductor substrate;

a gate electrode formed over a region of the semiconductor substrate, with an insulating film therebetween, said gate electrode being interposed between said first and second superconducting electrodes, the gate electrode being formed of a first layer of a first material, and a second layer, different in material from the first layer formed on top of said first layer, wherein said surfaces of said second layer which oppose said first and second superconducting electrodes extend further along a distance between said first and second superconducting electrodes than side surfaces of said first layer which oppose said first and second superconducting electrodes;

wherein a region of said semiconductor substrate between said first and second impurity-doped regions projects above a top surface of said first and second impurity-doped regions, and wherein said first and second impurity-doped regions, the first and second superconducting electrodes and the gate electrode are formed so that the projecting region of said semiconductor substrate acts as a channel region.

7. A superconducting field effect transistor comprising;

a semiconductor substrate;

first and second impurity-doped regions formed in the semiconductor substrate;

first and second superconducting electrodes formed on the semiconductor substrate; and a gate electrode formed over the semiconductor substrate with an insulating film therebetween and interposed between the first and second superconducting electrodes, the gate electrode being formed of a poly-silicon layer and a silicon nitride layer formed on the top of the poly-silicon layer, wherein a width of the silicon nitride layer extending in directions opposing said first and second superconducting electrodes, is greater than a width of the poly-silicon layer.

8. A superconducting field effect transistor comprising;

a semiconductor substrate;

first and second impurity-doped regions formed in the semiconductor substrate;

first and second superconducting electrodes formed on the semiconductor substrate; and a gate electrode formed over the semiconductor substrate with a first insulating film therebetween, said gate electrode being interposed between the first and second superconducting electrodes, side surfaces of said gate electrode opposing said first and second superconducting film being coated with a second insulating film.

9. A superconducting field effect transistor according to claim 8, wherein a distance between said first and second superconducting electrodes is equal to the sum of the width of the gate electrode and the resultant thickness of the second insulating film formed on those side surfaces of the gate electrode which oppose said first and second superconducting electrodes.

10. A superconducting field effect transistor according to claim 8, wherein a material for said gate electrode is selected from a group consisting of poly-silicon and a silicon compound, wherein a silicon nitride layer is formed atop said gate electrode, side surfaces of said silicon nitride layer which oppose said first and second superconducting electrodes, extending beyond side surfaces of the gate electrode which oppose said first and second superconducting electrodes, wherein a distance between said first and second superconducting electrodes is determined by the width of the silicon nitride layer.

11. A superconducting field effect transistor according to claim 8, wherein said gate electrode is made of a superconducting material.

12. A superconducting field effect transistor according to claim 8, wherein a distance between said first and second superconducting electrodes is made three to ten times larger than the coherence length in said semiconductor substrate, to establish a superconducting weak link between said first and second superconducting electrodes through said semiconductor substrate.

13. A superconducting field effect transistor according to claim 8, wherein the second insulating film on the side surface of said gate electrode is made of silicon nitride.

14. A superconducting field effect transistor according to claim 8, wherein the side surface of said gate electrode is coated with the second insulating film prior to the formation of the first and second superconducting electrodes.

* * * * *

UNITED STATES PATENT AND TRADEMARK OFFICE
CERTIFICATE OF CORRECTION

PATENT NO. : 5,317,168
DATED      : May 31, 1994
INVENTOR(S) : Toshikazu NISHINO et al.

It is certified that error appears in the above-indentified patent and that said Letters Patent is hereby corrected as shown below:

| Column | Line | |
|---|---|---|
| 1 | 53 | After "second" insert --layer--. |
| 3 | 63 | Change "$O_{7-67}$" to --$O_{7-8}$--. |
| 5 | 37 | Change "5 x $10^{18}$" to --5 x $10^{18}$--. |
| 8 | 53 | Change "electro" to --electron--. |
| 10 | 45 | Change "Further," to --Furthermore,--. |

Signed and Sealed this

Twenty-eight Day of February, 1995

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO. : 5,317,168
DATED : May 31, 1994
INVENTOR(S) : Nishino, et al

It is certified that error appears in the above-identified patent and that said Letters Patent is hereby corrected as shown below:

Column 14, line 20, Before "formed" insert --and--.

Signed and Sealed this

Eighteenth Day of February, 1997

Attest:

BRUCE LEHMAN

*Attesting Officer*                    *Commissioner of Patents and Trademarks*